(12) United States Patent
Schimmel et al.

(10) Patent No.: US 9,113,539 B2
(45) Date of Patent: Aug. 18, 2015

(54) RADIATION SOURCE

(75) Inventors: Hendrikus Gijsbertus Schimmel, Utrecht (NL); Johan Frederik Dijksman, Weert (NL); Dzmitry Labetski, Utrecht (NL)

(73) Assignee: ASML Netherlands B.V, Veldhoven (NL)

( * ) Notice: Subject to any disclaimer, the term of this patent is extended or adjusted under 35 U.S.C. 154(b) by 131 days.

(21) Appl. No.: 13/597,754

(22) Filed: Aug. 29, 2012

(65) Prior Publication Data

US 2013/0077070 A1 Mar. 28, 2013

Related U.S. Application Data

(60) Provisional application No. 61/538,765, filed on Sep. 23, 2011.

(51) Int. Cl.
| | |
|---|---|
| *G01N 21/01* | (2006.01) |
| *G03B 27/52* | (2006.01) |
| *G03B 27/54* | (2006.01) |
| *H05B 31/02* | (2006.01) |
| *H05G 2/00* | (2006.01) |
| *G03F 7/20* | (2006.01) |

(52) U.S. Cl.
CPC ............ *H05G 2/005* (2013.01); *G03F 7/70033* (2013.01); *G03F 7/70883* (2013.01); *G03F 7/70916* (2013.01); *H05G 2/006* (2013.01); *H05G 2/008* (2013.01)

(58) Field of Classification Search
CPC ... G03F 7/20; G03F 7/10033; G03F 7/70883; G03F 7/70908; G03F 7/70916; H05G 2/00–2/008

USPC .................. 250/428–435, 504 R; 313/231.31–231.61; 314/22; 355/30, 355/67; 378/34
See application file for complete search history.

(56) References Cited

U.S. PATENT DOCUMENTS

| | | | | |
|---|---|---|---|---|
| 2008/0035865 | A1* | 2/2008 | Komori et al. | 250/504 R |
| 2009/0272919 | A1* | 11/2009 | Abe et al. | 250/504 R |
| 2010/0025223 | A1* | 2/2010 | Yanagida et al. | 204/157.15 |
| 2011/0101863 | A1* | 5/2011 | Komori et al. | 315/111.41 |
| 2011/0284774 | A1* | 11/2011 | Ishihara et al. | 250/504 R |
| 2012/0104289 | A1* | 5/2012 | Mizoguchi et al. | 250/504 R |

FOREIGN PATENT DOCUMENTS

WO  WO 2010137625 A1 * 12/2010 ............... H05G 2/00

* cited by examiner

*Primary Examiner* — Colin Kreutzer
(74) *Attorney, Agent, or Firm* — Sterne, Kessler, Goldstein & Fox P.L.L.C

(57) ABSTRACT

A radiation source comprises a reservoir, a nozzle, a laser, and a positive lens. The reservoir is configured to retain a volume of fuel. The nozzle, in fluid connection with the reservoir, is configured to direct a stream of fuel along a trajectory towards a plasma formation location. The laser configured to direct laser radiation at the stream at the plasma formation location to generate, in use, a radiation generating plasma. The positive lens arrangement configured to focus an at least potential spread of trajectories of the stream of fuel toward the plasma formation location, the lens comprising an electric field generating element and/or a magnetic field generating element.

19 Claims, 6 Drawing Sheets

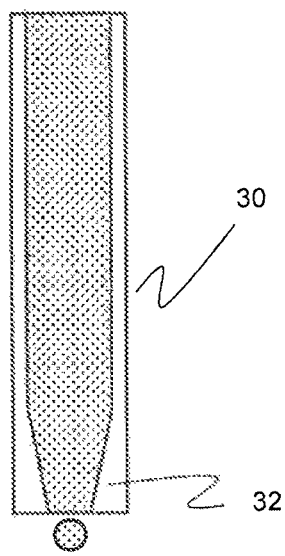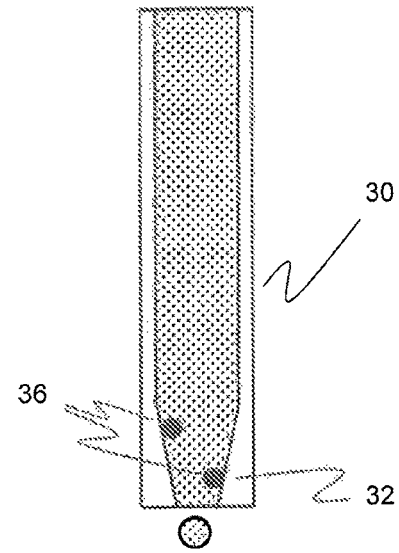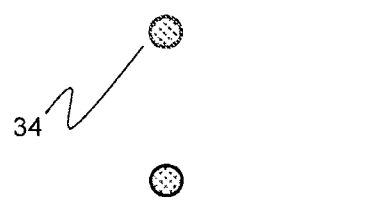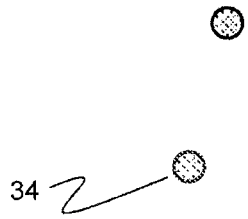
FIG. 3            FIG. 4

RADIATION SOURCE

CROSS REFERENCE TO RELATED APPLICATIONS

This application claims the benefit under 35 U.S.C. §119 (e) to U.S. Provisional Patent Application No. 61/538,765, filed Sep. 23, 2011, which is incorporated by reference herein in its entirety.

FIELD

The present invention relates to a radiation source, suitable for use in conjunction with, or forming part of, a lithographic apparatus. The present invention also relates more generally to fluid stream generator.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles (i.e., droplets) of a suitable fuel material (e.g., tin, which is currently thought to be the most promising and thus likely choice of fuel for EUV radiation sources), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source. In an alternative system, which may also employ the use of a laser, radiation may be generated by a plasma formed by the use of an electrical discharge—a discharge produced plasma (DPP) source.

A proposed LPP radiation source generates a continuous stream of fuel droplets. The radiation source comprises a nozzle for directing fuel droplets toward a plasma formation location. The droplets need to be directed to the plasma formation location with a high degree of accuracy in order to ensure that a laser beam may be directed toward and into contact with the droplets. In order to achieve this, fuel should pass through the nozzle without encountering any unexpected or unintentional obstructions or restrictions. Such obstructions or restrictions may result from contamination in the fuel being deposited on an internal surface of the nozzle. The contamination can result in a stream of droplets directed by the nozzle not having one or more required properties, for example a desired trajectory. Dynamics of the radiation source (e.g., thermal drift) might also result in a stream of droplets not having a desired trajectory. As a result, this can lead to the radiation source as a whole not functioning as intended, for example not being able to generate radiation, or not being able to generate radiation of the required intensity or for a required duration.

Although problems have been described in relation to LPP radiation sources, the same or similar problems may be encountered in conjunction with other fluid (e.g., liquid) stream generators (droplet or continuous), for example nozzles used in ink-jet and/or (molten) metal printing or the like. Also, the problems are not necessarily restricted to a stream comprising droplets—the same or similar problems may be encountered when a continuous stream is to be generated.

SUMMARY

It is desirable to obviate or mitigate at least one problem of the prior art, whether identified herein or elsewhere, or to provide an alternative to existing apparatus or methods.

According to a first aspect of the present invention, there is provided a radiation source comprising: a reservoir configured to retain a volume of fuel; a nozzle, in fluid connection with the reservoir, and configured to direct a stream of fuel along a trajectory towards a plasma formation location; a laser configured to direct laser radiation at the stream at the plasma formation location to generate, in use, a radiation generating plasma; and a positive lens arrangement configured to focus an at least potential spread of trajectories of the stream of fuel toward the plasma formation location, the lens comprising an electric field generating element and/or a magnetic field generating element.

The lens arrangement may be configured to ensure that a change in position or orientation of the nozzle is magnified by a factor of less than or equal to 1 at or relative to an intended position of the plasma formation location. This ensures that the lens arrangement does not magnify a change in position or orientation of the nozzle, and thus does not magnify any problems or disadvantages caused as a result.

The lens arrangement may also be configured to serve as, or at least form a part of, one or more of the following configurations: an extraction configuration for extracting fuel from the nozzle (e.g., in the form of a droplet); and/or an acceleration configuration for accelerating fuel constituting the stream of fuel; and/or a deceleration configuration for decelerating fuel constituting the stream of fuel; and/or a charge configuration for charging fuel constituting, or that will constitute, the stream of fuel.

The lens arrangement may be switchable (e.g., electrically) between the one or more configurations.

The lens arrangement might be switchable by application of an appropriate potential difference between: one or more of components of the lens arrangement; and/or one or more components of the lens arrangement and the nozzle; and/or one or more components of the lens arrangement and the charging arrangement.

A controller may be arranged to perform a switch between one or more of the configurations as a portion of the stream of fuel passes from the nozzle to the plasma formation location. That means that the lens arrangement might be selectively configured to perform different functions with respect to the same portion over a period of time.

The position and/or orientation of the lens arrangement may be controllable to control the position of a focal point. This may be achieved by physical movement of the lens arrangement, or one or more components thereof, and/or by control of the magnitude, shape or general configuration of an electric field and/or magnetic field used by the lens arrangement.

One or more further positive lens arrangements may be provided, and disposed along (and at least partially extending around) the potential spread of trajectories (e.g., upstream or downstream of the existing lens).

The lens arrangement may be an electrostatic lens arrangement, and/or a magnetostatic lens arrangement, and/or an Einzel lens.

The radiation source might further comprise a charging configuration for charging fuel constituting, or that will constitute, the stream of fuel. The charging configuration might be in electrical connection with one or more of the fuel, the reservoir, the nozzle, or any one or more other components that allows, or facilitates, the charging of the fuel before or after ejection from the nozzle.

The stream of fuel will most likely comprises a stream of droplets of fuel.

The fuel may be or comprise a molten metal.

According to a second aspect of the present invention, there is provided a fluid stream generator comprising: a reservoir configured to retain a volume of fluid; a nozzle, in fluid connection with the reservoir, and configured to direct a stream of fluid along a trajectory towards a target location (e.g., a substrate, an object, a sheet, or the like); and a positive lens arrangement configured to focus an at least potential spread of trajectories of the stream of fluid toward the target location, the lens comprising an electric field generating element and/or a magnetic field generating element.

According to a third aspect of the present invention, there is provided a lithographic apparatus comprising: an illumination system for providing a radiation beam; a patterning device for imparting the radiation beam with a pattern in its cross-section; a substrate holder for holding a substrate; a projection system for projecting the patterned radiation beam onto a target portion of the substrate, and wherein the lithographic apparatus further comprises, or is in connection with, the radiation source or fluid stream generator of the first and/or second aspect of the present invention.

According to a fourth aspect of the present invention, there is provided a method of converging a potential spread of trajectories of an electrically charged stream of fuel of a fuel stream generator, the method comprising: establishing a positive lens using an electric field and/or a magnetic field in a, and directing the charged stream of fluid through that positive lens.

It will be appreciated that one or more features described in relation to any one particular aspect of the present invention may, where appropriate, be applicable to any other aspect of the present invention.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 3 schematically depicts a nozzle of a radiation source configured to direct a stream of fuel droplets along a trajectory towards a plasma formation location.

FIG. 4 schematically depicts contamination deposition on an internal surface of the nozzle of FIG. 3, and an effect on a trajectory of droplets leaving the nozzle.

Figure 5:
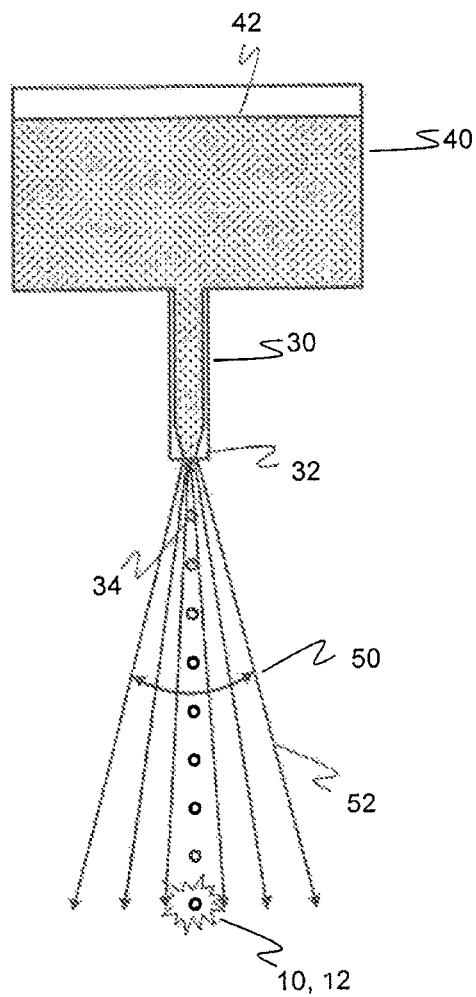

FIG. 5 schematically depicts a fuel stream generator, together with a potential spread of trajectories of the generated fuel stream.

Figure 6:
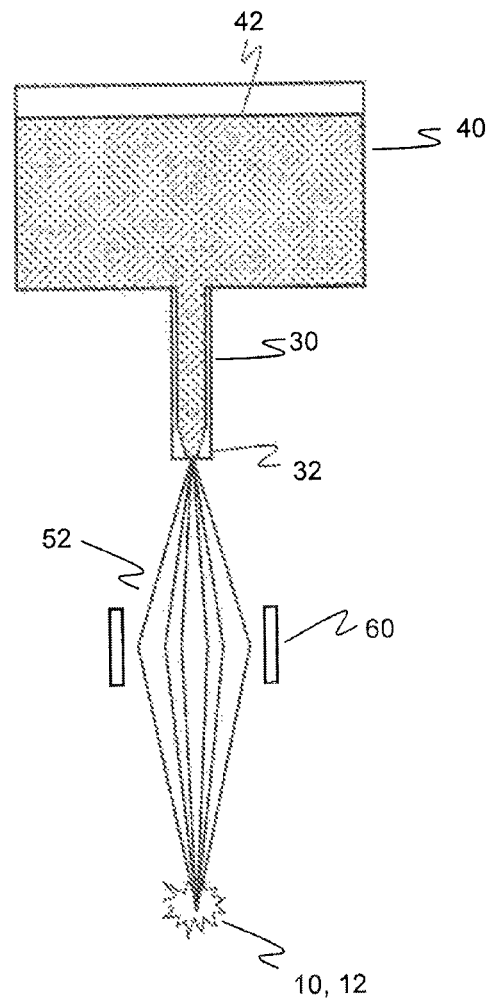

FIG. 6 schematically depicts a fuel stream generator according to an embodiment of the present invention, including a positive lens arrangement configured to focus a spread of trajectories of the generated fuel stream towards a plasma formation location.

Figure 7:
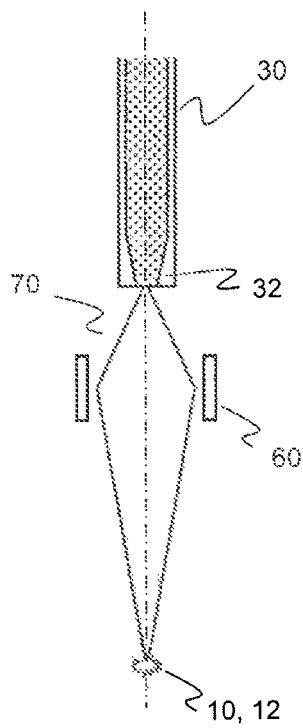
Figure 8:
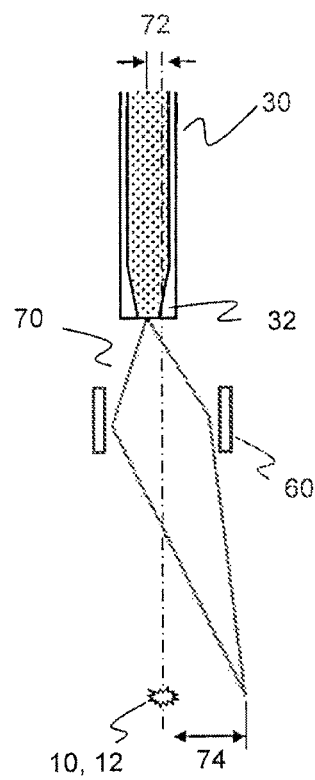

FIGS. 7 and 8 schematically depict how a change in position or orientation of a nozzle of a fuel stream generator can affect the focal point at which a spread of fuel stream trajectories is directed.

Figure 9:
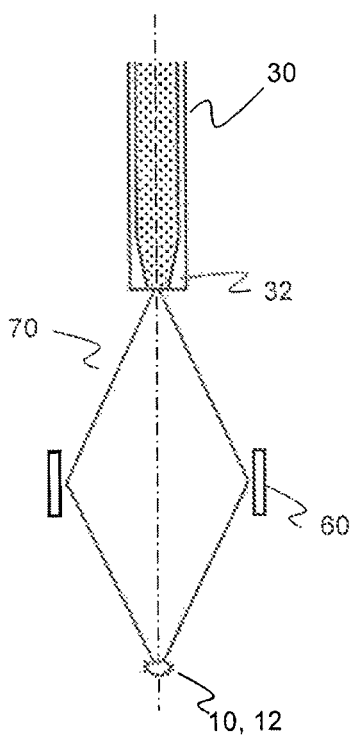
Figure 10:
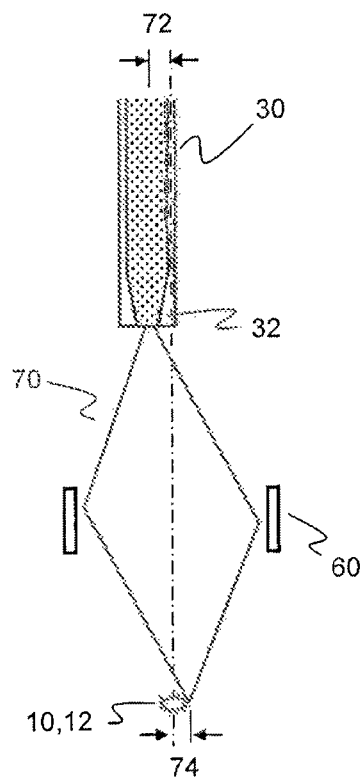

FIGS. 9 and 10 schematically depict how a change in position or orientation of a nozzle of a fuel stream generator can affect the focal point at which a spread of fuel stream trajectories is directed, but including a modification of the lens arrangement to reduce the effects of the change in position or orientation.

Figure 11:
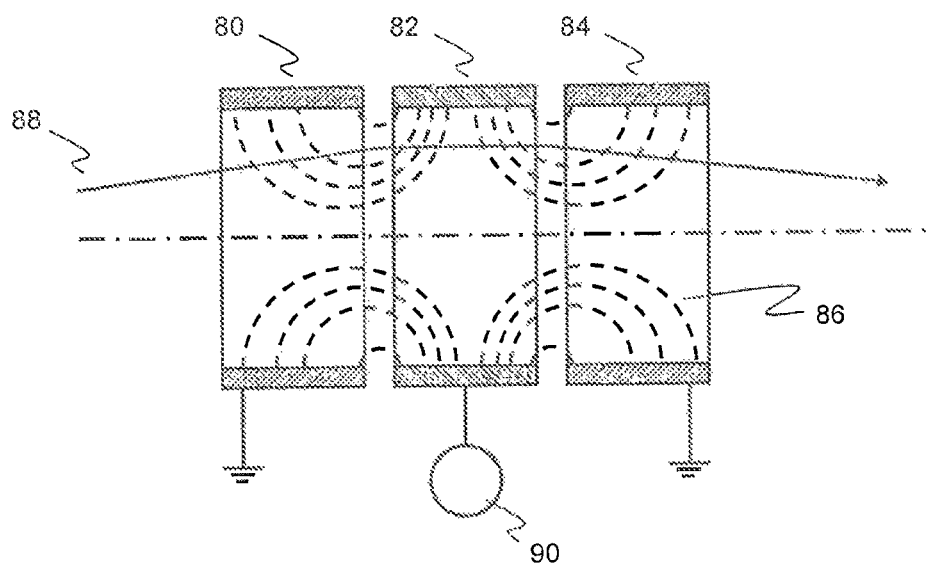

FIG. 11 schematically depicts an example of a lens arrangement.

Figure 12:
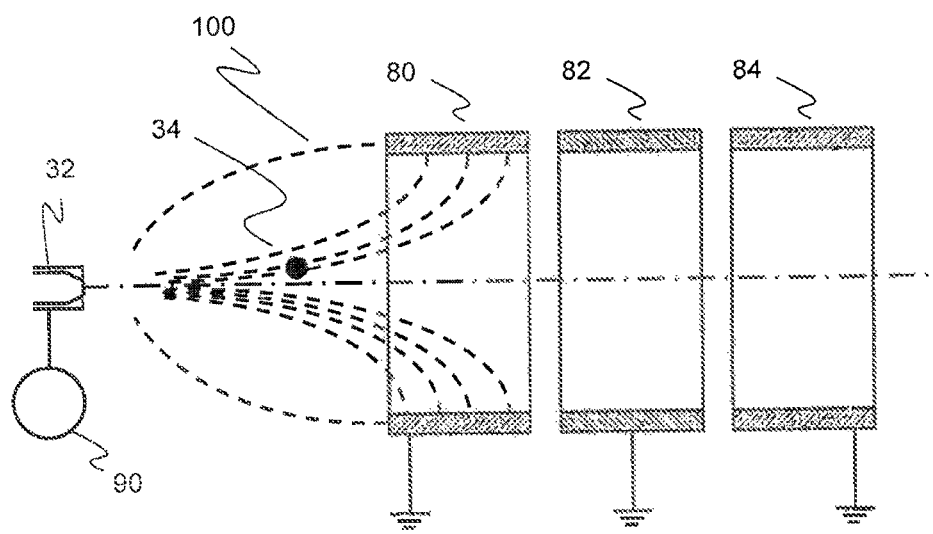

FIG. 12 schematically depicts how the lens arrangement of FIG. 11 can be used to accelerate and/or extract a charged droplet from a nozzle.

Figure 13:
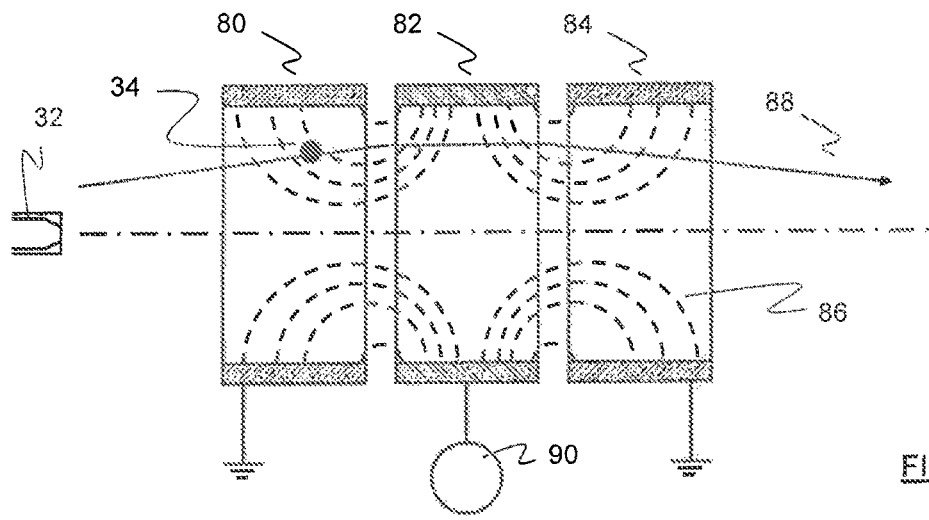
Figure 14:
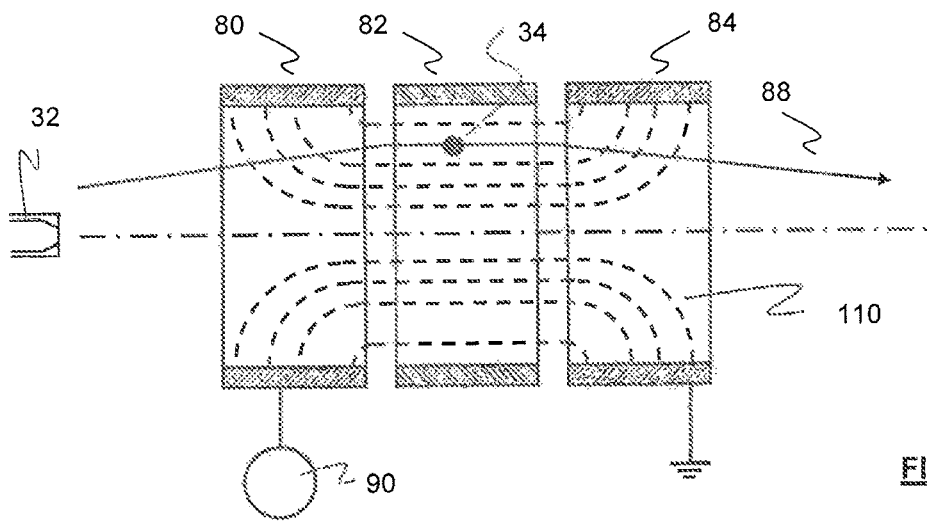
Figure 15:
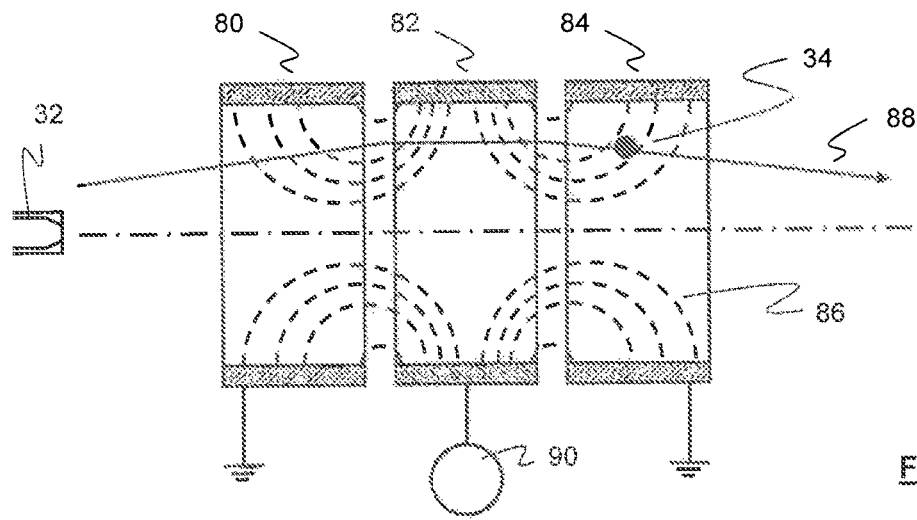

FIGS. 13 to 15 show how the lens arrangement of FIGS. 11 and 12 can be used to selectively focus and/or accelerate a charged fuel droplet.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Figure 1:
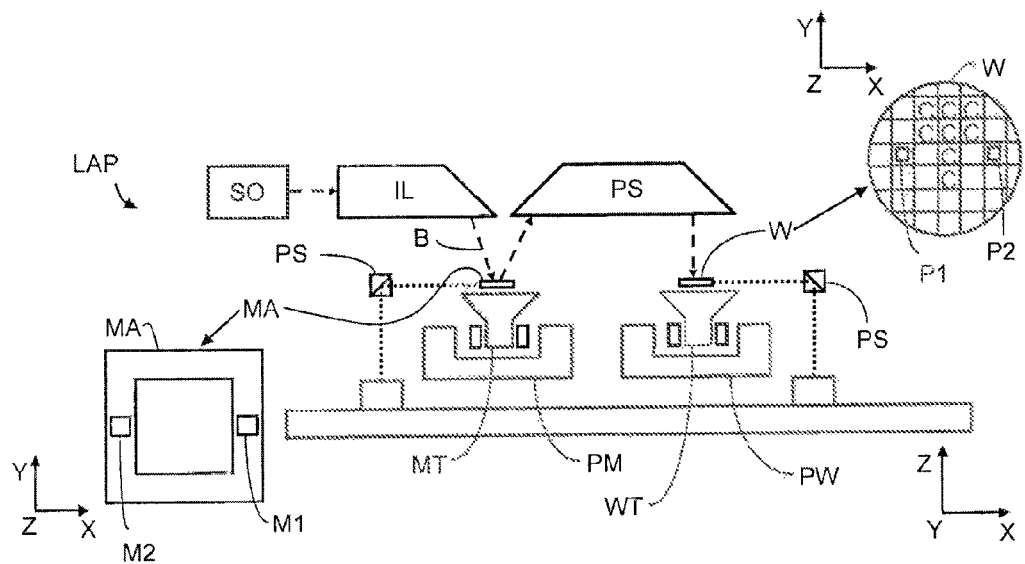
FIG. 1 depicts a lithographic apparatus according to an embodiment of the present invention.

FIG. 1 schematically depicts a lithographic apparatus LAP including a source collector module SO according to an embodiment of the present invention. The apparatus comprises: an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam and exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
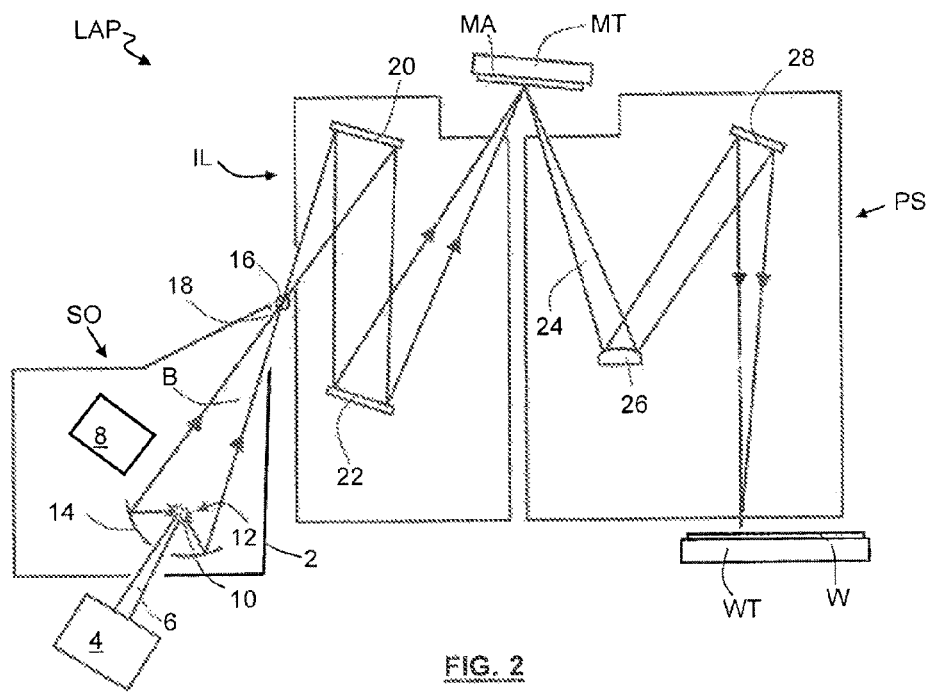
FIG. 2 is a more detailed view of the apparatus of FIG. 1, including an LPP source collector module.

FIG. 2 shows the lithographic apparatus LAP in more detail, including the source collector module SO, the illumination system IL, and the projection system PS. The source collector module SO is constructed and arranged such that a vacuum environment can be maintained in an enclosing structure 2 of the source collector module.

A laser 4 is arranged to deposit laser energy via a laser beam 6 into a fuel, such as xenon (Xe), tin (Sn) or lithium (Li) which is provided from a fluid stream generator 8. Liquid (i.e., molten) tin (most likely in the form of droplets), or another metal in liquid form, is currently thought to be the most promising and thus likely choice of fuel for EUV radiation sources. The deposition of laser energy into the fuel creates a highly ionized plasma 10 at a plasma formation location 12 which has electron temperatures of several tens of electronvolts (eV). The energetic radiation generated during de-excitation and recombination of these ions is emitted from the plasma 10, collected and focused by a near normal incidence radiation collector 14. A laser 4 and fluid stream generator 8 (and/or a collector 14) may together be considered to comprise a radiation source, specifically an EUV radiation source. The EUV radiation source may be referred to as a laser produced plasma (LPP) radiation source.

A second laser (not shown) may be provided, the second laser being configured to preheat the fuel before the laser beam 6 is incident upon it. An LPP source which uses this approach may be referred to as a dual laser pulsing (DLP) source.

Although not shown, the fuel stream generator will comprise, or be in connection with, a nozzle configured to direct a stream of, for example, fuel droplets along a trajectory towards the plasma formation location 12.

Radiation B that is reflected by the radiation collector 14 is focused at a virtual source point 16. The virtual source point 16 is commonly referred to as the intermediate focus, and the source collector module SO is arranged such that the intermediate focus 16 is located at or near to an opening 18 in the enclosing structure 2. The virtual source point 16 is an image of the radiation emitting plasma 10.

Subsequently, the radiation B traverses the illumination system IL, which may include a facetted field mirror device 20 and a facetted pupil mirror device 22 arranged to provide a desired angular distribution of the radiation beam B at the patterning device MA, as well as a desired uniformity of radiation intensity at the patterning device MA. Upon reflection of the beam of radiation at the patterning device MA, held by the support structure MT, a patterned beam 24 is formed and the patterned beam 24 is imaged by the projection system PS via reflective elements 26, 28 onto a substrate W held by the wafer stage or substrate table WT.

More elements than shown may generally be present in the illumination system IL and projection system PS. Furthermore, there may be more mirrors present than those shown in the figures, for example there may be 1-6 additional reflective elements present in the projection system PS than shown in FIG. 2.

FIG. 3 schematically depicts a part of the fuel stream generator as shown in and described with reference to FIG. 2. The part of the fuel stream generator is shown as comprising a conduit 30 which includes and leads to a nozzle 32 configured to direct a stream of droplets of fuel 34 along a trajectory towards a plasma formation location (not shown). In another example, the same (or a modified) part of the fuel stream generator may provide a continuous stream of fuel.

Stability and/or clogging (i.e., at least partial blocking) of the nozzle 32 are issues that may arise during use of the nozzle 32, as they do for any ink jet printing application. Clogs will be formed by contamination in the fuel. Clogging of the nozzle 32 may impose a lifetime limit on the nozzle and thus the fuel stream generator (or at least a time limit at which limit replacement, maintenance, or cleaning is required) and may therefore limit the availability of the radiation source or the lithographic apparatus as a whole.

It is most likely that the nozzle 32 of the fuel stream generator will have the smallest, or one of the smallest, diameters as compared to other conduits and the like of a fuel flow system forming part of the fuel stream generator. Since the nozzle 32 will have one of the smallest diameters, it is likely that clogging in a fuel flow path will occur near or at the nozzle 32, and likely within the nozzle 32 which is a restriction in the fuel flow system. Such clogging might result in a change in the effective geometry of the nozzle.

A change in effective geometry may result in a change in the parameters of the generated stream/stream of droplets, for instance droplet or stream shape or size, or most likely a change of direction of trajectory of the stream/stream of droplets. In many applications, such parameters will need to meet stringent requirements. In an EUV radiation source in particular, the requirements of the droplet generator will be extremely stringent in terms of the positional accuracy of the trajectory of the droplet stream. For instance, at a plasma formation location, the location of a droplet may need to be accurate to within a few microns, but at the same time the nozzle 32 itself may need to be located relatively far away from the plasma formation location, for instance by a distance of a few tens of centimeters or so. This results in a direction stability requirement of the trajectory of the stream of droplets of perhaps less than 10 microradians. The overall result is that even very small particulate contamination deposited on the internal surface of the nozzle, or passing through the nozzle, can change the effective geometry of the nozzle (even for a very short period of time) to such an extent that the direction stability requirement is not met. This might, in turn have a detrimental effect on the operation of the radiation source and thus the lithographic apparatus as a whole, for example in terms of the generation of radiation.

FIG. 4 schematically depicts the same conduit 30, nozzle 32 and droplet stream 34 as shown in and described with reference to FIG. 3. However, in FIG. 4 contamination in the form of particles 36 has become deposited on the internal surface of the nozzle 32. Such deposition has resulted in a change in the effective geometry of the nozzle 32 (as described above), which has resulted, in turn, in a change in trajectory of the stream of droplets 34. The change might be long term and constant if the contamination 36 remains in the same place, but the change could be short term and variable if the contamination moves, for example through the nozzle. This can lead to a rapid change in the trajectory direction.

The particles 36 are one example of contamination. The contamination could be particulate in form, or be anything else which might be present within the fuel used to form the droplet stream 34 (e.g., flakes, agglomerations, or the like). The contamination could arise from oxidization of the fuel. For example, if the fuel is tin (or another molten metal), the contamination may be tin oxide particles (or oxides of whatever metal is used) or the like. Alternatively and/or additionally, the contamination could be particles or the like of materials from apparatus used upstream within the fuel flow system.

FIG. 5 schematically depicts a fluid stream generator of a radiation source. The fluid stream generator comprises a reservoir 40 configured to retain a volume of fuel 42 used in the generation of radiation (e.g., a molten metal such as tin). The reservoir 40 is in fluid connection with (i.e., able to supply fuel to) the conduit 30 and nozzle 32 already shown in and described with reference to FIGS. 3 and 4 above. Referring back to FIG. 5, pressure may be applied to the fuel 42 (e.g., mechanical or fluid pressure) to force ejection of fuel 42 through the nozzle 32. Alternatively and/or additionally, an electric or magnetic field may be provided to extract fuel 42 from the nozzle (e.g., to extract a droplet from a meniscus or the like at the nozzle 32).

A stream of fuel droplets 34 is shown having an ideal trajectory which exactly coincides with an intended plasma formation location 10, 12. However, the droplets will not always have this trajectory. Instead, there may be a spread 50 of trajectories or potential trajectories 52 (potential trajectories being trajectories that are possible, but which may not always be present in a spread). The spread 50 of trajectories 52 may be attributed to contamination within or flowing through the nozzle 32, which can result in a relatively long-term slowly varying change in trajectory (e.g., if contamination is stuck in position within the nozzle 32), or a relatively short-term rapidly varying change in the trajectory 52 (e.g., due to contamination flowing through the nozzle 32, or due to other disturbances at or near the nozzle 32). It is most likely that the trajectories 52 will change direction very rapidly due to the changes in the effective geometry of the nozzle 32, for example changing at a frequency of 100 Hz or 200 Hz or higher. This is in contrast with more slowly changing conditions which can also affect the trajectory 52 of the fuel droplets 34. For instance, more slowly varying changes might result from system dynamics, for example thermal drift or the like, which could result in a change in position or orientation of the nozzle 32.

Although not shown in the Figure, the spread of trajectories 52 may alternatively or additionally be related to the method by which droplets 34 are extracted from the nozzle 32. For instance, if an electric field or the like is used to extract droplets 34 from the nozzle 32, the electric field may additionally cause a slightly divergence (i.e., spread) in the trajectories of those droplets, especially if the droplet stream does not pass through an electric field that has lines of flux parallel to that stream (e.g., due to slight misalignment, or system drift). Alternatively or additionally, the spread of trajectories 52 may be due to wear on the nozzle, which can also cause a change in its effective geometry.

In a typical fuel stream generator, there may already be systems in place for taking into account and correcting for slowly varying changes in fuel stream trajectory, e.g., arising from slowly varying changes in position or orientation of the nozzle. These changes may be undertaken perhaps at a few times per second, or at a lower frequency. However, these systems are incapable of correcting for the higher frequency changes in the trajectories caused by more quickly varying changes in the system, which can result in changes of 100 Hz or 200 Hz or higher. Put simply, the systems in place for accommodating for, or correcting for, slower changes do not have the required bandwidth for correcting for the higher frequency changes.

In FIG. 5, the different trajectories 52 are shown as resulting in at least some of those trajectories missing or bypassing a plasma formation location 10, 12. Although exaggerated in the Figure, the changes in the trajectories 52 might at least result in a laser beam or the like not targeting a droplet as desired, for example not targeting the entire droplet (e.g., having a glancing angle of incidence) or not having a desired angle of incidence, or the like. This could result in a lower conversion efficiency than expected (i.e., the amount of EUV radiation that is generated for a given set of input parameters). It is therefore desirable to ensure that the trajectories coincide as far (and as precisely) as possible with an intended plasma formation location, in order to maximize conversion efficiency, or to maintain efficient and consistent conversion efficiencies.

In accordance with an embodiment of the present invention, the problems mentioned above may be obviated or mitigated. The present invention provides a radiation source. The radiation source comprises a reservoir configured to retain a volume of fuel. A nozzle is also provided, in fluid communication with the reservoir, and configured to direct a stream of fuel along a trajectory towards a plasma formation location (which may be referred to as an intended plasma formation location, or a target location). A laser is also provided, and configured to direct laser radiation at the stream at the plasma formation location to generate, in use, a radiation generating plasma. The present invention is distinguished from existing radiation sources (or, more generally, fluid stream generators for use in such sources) by being provided with a positive lens arrangement configured to focus an at least potential spread of trajectories of the stream of fuel generally toward the plasma formation location. The term "at least potential spread" is included since, of course, not all trajectories within limits of a spread may be encountered in use. The positive lens arrangement comprises an electric field generating element and/or a magnetic field generating element, for example, for use in generating an electric field and/or a magnetic field, respectively, for use in focusing the spread of trajectories. The lens arrangement may be an electrostatic lens and/or a magnetostatic lens.

The present invention is particularly suited to correcting rapidly changing variations in the trajectory direction. This is because, in accordance with the present invention, the correction (which amounts to the focusing) is effectively passive, and does not require any sort of feedback loop or on-the-fly correction or the like. The present invention can also be used to correct and accommodate (or reduce the effects of) slowly changing variations in the trajectory which may be attributed to system dynamics, for example, thermal drift or the like, which may also result in changes in the position or orientation of the nozzle. Thus, the inclusion of a positive lens arrangement may solve a problem not currently solvable with existing apparatus and methods, and also a problem that is presently solved by alternative means. This may lead to a more simplified and/or cheaper design of the fuel stream generator or radiation source or, at the very least, a design that is capable of taking into account at least quickly varying variations in trajectory, if not both high frequency (e.g., greater than 100 Hz or 200 Hz) variations and low frequency (e.g., 10 Hz or less) variations.

FIG. 6 shows a similar fluid stream generator to that shown in and described with reference to FIG. 5. However, the fluid stream generator of FIG. 6 is now provided with a positive lens arrangement 60. The positive lens arrangement 60 is located downstream of the nozzle 32 and, in this embodiment, at least partially surrounds a potential spread of trajectories 52 of the fuel stream.

The positive lens arrangement 60 is configured to focus the spread of trajectories 52 toward the intended plasma formation location 10, 12. The focal point of the lens arrangement 60 will ideally coincide with the intended plasma formation location 10, 12. The positive lens arrangement 60 achieves the focusing function using an electric field and/or a magnetic field to deflect or otherwise direct the fluid stream. In order to achieve this, the fluid stream (e.g., components, filaments, droplets or the like thereof) might need to be electrically charged. A charge configuration may thus also form part of the fuel stream generator (although not shown in the Figure) to provide the charging of the fuel stream. For instance, a charge tunnel may provide the charging. Alternatively, the reservoir or nozzle may be held at an elevated potential to ensure that the fuel therein is also held at that potential. When the stream then leaves the nozzle, it will be charged.

The positive lens arrangement 60 may be described as a positive charged particle lens. Many such examples of charged particle lenses exist. The charged particle lens may be, for example, a quadrupole lens, an aperture lens, a cylinder lens or an Einzel lens (which is a specific example of a cylinder lens, described in more detail below). An Einzel lens may be preferred since this lens focuses without changing the energy of the stream being focused. The exact type and design and the like of such a lens is not the subject of the present invention. Instead, the present invention lies in the application of such a lens in a fluid droplet generator, to control the spread of trajectories of fluid streams generated by such a generator. Similarly, a configuration by which the fluid stream may be charged is, again, not the subject of the present invention and will, for example, be well known in the field of fluid droplet generators. As a result, configurations by which the stream may be charged is not described in more detail here.

FIG. 7 schematically depicts a nozzle 32, an outer extent of a spread of potential trajectories 70, and an intended plasma formation location 10, 12. A positive lens arrangement 60 is also provided, which focuses the spread of trajectories 70 to the plasma formation location 10, 12. FIG. 8 shows how a slow, but perhaps long-term, change in the position of the nozzle 32 has an effect on the location at which the spread of trajectories 70 is focused. In summary, it can be seen that a change in position 72 of the nozzle 32 is magnified by a factor of greater than one relative to 74 an intended position of the plasma formation location 10, 12. This means that even a slight shift of position or orientation of the nozzle 32 will be magnified downstream when considering the focal point of the trajectories 70 relative to the intended position of the plasma formation location. Such a magnification may make it more difficult to target the fuel stream with a laser, which can result in a degradation in the performance of the radiation source as a whole. Alternatively or additionally, the magnification may make it harder for correction systems to accommodate and correct for such shifts in position or orientation of the nozzle.

FIG. 9 provides a solution to the problems shown in and described with reference to FIGS. 7 and 8. In general, the lens arrangement 60 is now configured to ensure that a change in position or orientation of the nozzle 32 is magnified by a factor of less than or equal to one at or relative to an intended position of the plasma location formation 10, 12. In FIG. 9, this has been achieved by ensuring that the lens arrangement 60 is located further downstream than shown in FIGS. 7 and 8, but at the same time being wider and more powerful than shown in FIGS. 7 and 8. Referring to FIG. 10, a slow, but perhaps long-term, change in the position of the nozzle 32 again has an effect on the location at which the spread of trajectories 70 is focused. However, it can be seen that a change in position 72 of the nozzle 32 is de-magnified when considering the focal point of the trajectories 70 relative to 74 an intended position of the plasma formation location 10, 12. This means that any resultant change in the position of the focus of the spread of trajectories 70 is closer to the intended plasma formation location 10, 12 than that displacement 72. Thus, the arrangement in FIG. 10 is less sensitive to long-term, slowly varying drifts than the arrangement in FIG. 8.

The configuration of the lens needed to achieve the affect shown in and described with reference to FIGS. 9 and 10 may be achieved by moving one or more elements of a given lens arrangement, or by providing a different lens arrangement (e.g., further downstream), or by appropriately activating downstream components of the same lens arrangement.

In accordance with the principles shown in and described with reference to FIGS. 9 and 10, the present invention can be used to correct and compensate for rapidly changing trajectory directions (i.e., by focusing), but can also be used to at least partially correct and compensate for (or at least minimize the effects of) slowly varying system dynamics (for example, thermal drift or the like) which might result in changes in position or orientation of the nozzle 32. Alternatively and/or additionally (and in general), the position and/or orientation of the lens arrangement 60 may be controllable to control position of the focal point. This may result in there being no need to be able to provide separate apparatus for compensating for drift in the position of the nozzle or the like, allowing the fluid stream generator as a whole to have fewer components. The position and/or orientation of the lens arrangement 60 may be controllable by physical movement of the lens arrangement, or one or more components thereof, and/or by control of the magnitude, shape or general configuration of an electric field and/or magnetic field used by the lens arrangement FIG. 11 shows a typical configuration for the lens arrangement, taking the form of an Einzel lens. The lens arrangement comprises three cylindrical electrodes 80, 82, 84 axially disposed along and around a potential spread of trajectories of the fluid stream. Appropriate electric fields 86 for focusing a divergent trajectory of a fuel stream 88 may be provided by establishing an appropriate potential difference between the cylindrical electrodes 80, 82, 84 of the lens. In FIG. 11, a potential difference is established between a central cylindrical electrode 82 of the three electrodes 80, 82, 84 to achieve a focusing electric field within the electrodes 80, 82, 84. This potential difference may be established by providing a voltage 90 to the central electrode 82, which maintaining the remaining outer electrodes 80, 84 at ground. Of course, other arrangements are possible, for example, providing any appropriate potential difference (not necessarily relative to ground) between different electrodes 80, 82, 84).

A numerical example is now provided. The outer cylinders 80, 84 may be grounded are grounded, while the central cylinder is connected to static voltage of, for example, 1000 V (chosen to be this low because of the potential break through between the charged cylinder 82 and the grounded cylinders 80, 84)

An off-set velocity of a charged droplet passing through a field 86 generated by one set of grounded 80, 84 and charged 82 cylindrical electrodes is given by:

$$\Delta v_r = \int_0^z \frac{QE_r(r, z)}{Mv} dz$$

with z the co-ordinate measured along the axis of symmetry of the electrodes 80, 82, 84, Q the charge of the droplet, $E_r$ the gradient of the electric field in radial direction, M the mass of the droplet and v the velocity.

In one typical example, the droplet radius=12.3 µm, droplet volume=7.85 pl and droplet mass=$5.46*10^{-11}$ kg (when the fuel is tin). A Raleigh charge limit appears to be $2.4*10^{-12}$ C. An estimate of the field gradient is 1000 volt over 10 mm (e.g., a typical diameter of the electrodes 80, 82, 84)=$10^5$ V/m. The lensing/focussing takes place over say 10 mm. For a droplet velocity of 100 m/s, the change in radial velocity appears to be roughly 0.5 m/s. This defines the focal point at about 1 m.

It will be appreciated that the lensing/focusing action depends on the charge of the droplet and the applied voltage. This gives two possibilities to define the position of the focal point, which can be appropriately set in advance, and/or tuned during operation or setup.

The lens arrangement discussed herein may have multipurpose functionality. For instance, the lens arrangement may also be configured to serve as, or at least form part of, one or more of:

an extraction configuration for extracting fuel from the nozzle (e.g., in the form of a droplet); and/or an acceleration configuration for accelerating fuel constituting the stream of fuel; and/or a deceleration configuration for decelerating fuel constituting the stream of fuel (the acceleration and/or deceleration being used, for instance, to control the separation between droplets of a fuel stream, or even to coalesce droplets if and when desired); and/or a charged configuration for charging fuel constituting, or that will constitute, the stream of fuel.

The lens arrangement will not necessarily need to be permanently in one of the abovementioned configurations. Instead, and most likely, no physical change will be required, and instead the lens arrangement will be (electrically) switchable between one or more configurations. For instance, the lens arrangement may be switchable between the configurations by the application of an appropriate potential difference between: one or more components of the lens arrangement (e.g., electrodes or coils thereof); and/or one or more components of a lens arrangement and the nozzle from which the stream is directed; and/or one or more components of the lens arrangement and a charge arrangement (if and when present). Such switching may be achieved by an appropriately configured controller, for example comprising appropriate electronics or the like. In some embodiments, the lens arrangement may function as a lens arrangement for a particular period of time during which one or more droplets or fuel stream portions are passed through the lens, and then function as an accelerating, or decelerating, or charging configuration at another period of time. Due to the versatility which the lens arrangement provides, it is most likely that the controller could be arranged to perform the switch between the one or more configurations as a portion of the stream of fuel passes from the nozzle to the plasma formation location. For instance, a given portion may be charged, and/or extracted from the nozzle, and/or accelerated toward the plasma formation location (or decelerated), and/or focused all using the same lens arrangement. The same of different configuration may be used on more than one occasion as the droplet passes from nozzle to plasma formation location.

An example of how a switch between configurations will now be described with reference to FIGS. 12 to 15.

FIG. 12 shows much the same lens arrangement as shown in and described with reference to FIG. 11. The nozzle 32 is now also shown. The nozzle 32 may, in this embodiment, may be made from a conducting material, such as molybdenum or titanium. In order to detach a droplet 34 from a meniscus or the like at the nozzle 32, and in a controlled manner, a continuous flow may be maintained through the nozzle 32, or a body of fuel caused to remain at or adjacent to the nozzle 32 exit. From time to time, an electric field 100 is switched on by establishing a potential difference 90 between the nozzle 32 and one or more of the electrodes 80, 82, 84 (which may be grounded). The field 100 charges the meniscus surface, separating a droplet 34 from the nozzle 34 and accelerating it in the electrical field 100, which field 100 that is diverging. If the droplet 32 is not directed to pass directly through the center of the electrodes 80, 82, 84, the droplet will have a trajectory that follows the divergent field lines 100.

FIG. 13 shows the same arrangement as shown in and described with reference to FIG. 11, although the droplet 34 is now shown in relation to the initially divergent trajectory. At some time between the droplet 34 being extracted and passing though the electrodes 80, 82, 84, the lensing/focusing electrical field 86 is switched on, re-directing the charged droplet 34 towards the focal point of the lens/lensing field.

The lens may be used to accelerate or further accelerate the droplet 34. Referring to FIG. 14, the first cylindrical electrode 80 is connected to a voltage source 90. The central electrode 82 may be left with a floating potential. The third electrode 84 is grounded. An electrical field 110 with an axial gradient is established in-between the first 80 and third 84 electrodes, accelerating the droplet 34. After a short time, the acceleration field is switched off and the lensing field is switched on, as shown in FIG. 15. This procedure may be repeated a number of times, to successively or sequentially accelerate (or decelerate, if required) the droplet 34 and focus its trajectory.

As a numerical example, lensing and accelerating regions may be about 10-15 mm long. A droplet with a speed of 50 m/s will stay in that region for around 300 microseconds. The capacitance of the electrode arrangement is likely to be small, and the resistance and parasitic capacitance of any associated wiring can also be made to be small. This can allow the RC time of the Einzel lens to be as low as 1 µs or so. This allows for a switching rate of at least 100 kHz, and thus switches between lensing/focusing and acceleration configurations. Thus, half of the time the droplet may be accelerated, and half of the time the trajectory may be focused. By choosing different times for lensing and acceleration, different timing regimes can be used. In this way, the droplet speed can be increased (e.g., by meters per second, or tens of meters per second), while ensuring the focusing as required is also achieved.

In the abovementioned embodiments, a single lens arrangement has been shown. However, one or more further positive lens arrangements may be provided. Such further lens arrangements may be provided and disposed along the potential spread of trajectories (e.g., upstream or downstream) of the lens arrangement already shown in and described with reference to the Figures. The one or more further lens arrangements do not necessarily need to be separate, independent pieces of apparatus or the like disposed in isolation at different points along the trajectory of the fuel stream. Instead, an array or the like of electrodes and/or coils (or other magnetic field generating elements) may be disposed along the potential trajectory of the fuel stream, and selectively activated or deactivated to provide one or more lens arrangements along that trajectory.

In the above embodiments, an electric field has been used to show how a spread of trajectories may be focused. An electric field generation element may comprise one or more electrodes or other components. A magnetic field can also be used to achieve the same effect. A magnetic field may be provided or established using a permanent magnet arrangement (e.g., being or comprising one or more permanent magnets), or by an electromagnet arrangement (e.g., being or comprising one or more solenoids).

In the Figures, the reservoir, conduit and nozzle are shown as having a substantially vertical orientation. However, other orientations are possible, for example a substantially horizontal orientation, or orientation at another angle.

In the Figures, the nozzle is shown as extending from the reservoir via the conduit. In another embodiment, the nozzle could extend directly from the conduit, or could form a part of the conduit (e.g., the nozzle could be formed in a wall of the conduit).

In the embodiments, reference has been made to the fuel being or comprising liquid tin, and contamination being or comprising particles or the like of tin oxide. However, the present invention may be applicable to other types of liquid/fuel, for example inks or a molten metal, with contamination potentially comprising an oxide of that ink or metal.

Although the abovementioned embodiments have been described in relation to a radiation source, the present invention may be applicable and particularly useful in other applications where nozzles for use in fluid stream generators are required, for example in the field of ink jet printing, or metal printing, or the like. In those other applications, the fluid stream might not be directed toward a plasma formation location, but more generally a target location. The target location could be, for instance, a sheet of material, a substrate, or the like. Implementation of the present invention in relation to a radiation source might be particularly preferred, however, given the sensitivity of such a radiation source to even very small (e.g., of the order of micrometers) changes in the trajectory direction of a fuel stream.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, LEDs, solar cells, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

When describing the lithographic apparatus, the term "lens," where the context allow, may refer to any one or combination of various types of optical components, including refractive, reflective, magnetic, electromagnetic and electrostatic optical components.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A radiation source comprising:
   a reservoir configured to retain a volume of fuel;
   a nozzle, in fluid connection with the reservoir, and configured to direct a stream of fuel along a trajectory towards a plasma formation location;
   a laser configured to direct laser radiation at the stream at the plasma formation location to generate a radiation generating plasma; and
   a positive lens arrangement configured to focus an at least potential spread of trajectories of the stream of fuel toward the plasma formation location, the lens comprising an electric field generating element and/or a magnetic field generating element;
   wherein the positive lens arrangement is switchable between a first configuration that focuses the at least potential spread of trajectories of the stream of fuel toward the plasma formation location, a second configuration different than the first configuration that accelerates fuel after being extracted from the nozzle, and at least one of the following configurations different than the first and second configurations:
      an extraction configuration to extract fuel from the nozzle,
      a deceleration configuration to decelerate fuel constituting the stream of fuel, and
      a charge configuration to charge fuel constituting, or that will constitute, the stream of fuel.

2. The radiation source of claim 1, wherein the lens arrangement is configured to ensure that a change in position or orientation of the nozzle is magnified by a factor of less than or equal to 1 at or relative to an intended position of the plasma formation location.

3. The radiation source of claim 1, wherein the lens arrangement is switchable by application of an appropriate potential difference between:
   one or more of components of the lens arrangement;
   one or more components of the lens arrangement and the nozzle; or
   one or more components of the lens arrangement and the charging configuration.

4. The radiation source of claim 1, wherein a controller is arranged to perform a switch between one or more of the configurations as a portion of the stream of fuel passes from the nozzle to the plasma formation location.

5. The radiation source of claim 1, wherein the position or orientation of the lens arrangement is controllable to control the position of a focal point.

6. The radiation source of claim 1, wherein one or more further positive lens arrangements are provided, and disposed along the potential spread of trajectories.

7. The radiation source of claim 1, wherein the lens arrangement is an electrostatic lens arrangement, a magnetostatic lens arrangement, or an Einzel lens.

8. The radiation source of claim 1, further comprising a charging configuration for charging fuel constituting, or that will constitute, the stream of fuel.

9. The radiation source of claim 1, wherein the stream of fuel comprises a stream of droplets of fuel.

10. The radiation source of claim 1, wherein the fuel is a molten metal.

11. The radiation source of claim 1, wherein the lens arrangement comprises a first electrode, a second electrode, and a third electrode, the second electrode being between the first and third electrodes; and
   wherein the first configuration comprises a potential difference between the first electrode and the second electrode and a potential difference between the second electrode and the third electrode.

12. The radiation source of claim 1, wherein the lens arrangement comprises a first electrode, a second electrode, and a third electrode, the second electrode being between the first and third electrodes; and
   wherein the second configuration comprises a potential difference between the first electrode and the third electrode.

13. The radiation source of claim 1, wherein the lens arrangement comprises a first electrode, a second electrode, and a third electrode, the second electrode being between the first and third electrodes; and
   wherein the second configuration comprises a potential difference between the first electrode and the third electrode.

14. A lithographic apparatus comprising:
   an illumination system configured to provide a radiation beam;
   a patterning device configured to impart the radiation beam with a pattern in its cross-section;
   a substrate holder configured to hold a substrate;
   a projection system configured to project the patterned radiation beam onto a target portion of the substrate, and wherein the lithographic apparatus further comprises, or is in connection with, a radiation source comprising:
a reservoir configured to retain a volume of fuel;
a nozzle, in fluid connection with the reservoir, and configured to direct a stream of fuel along a trajectory towards a plasma formation location;
a laser configured to direct laser radiation at the stream at the plasma formation location to generate a radiation generating plasma; and
a positive lens arrangement configured to focus an at least potential spread of trajectories of the stream of fuel toward the plasma formation location, the lens comprising an electric field generating element and/or a magnetic field gene rating element;
wherein the positive lens arrangement is switchable between a first configuration that focuses the at least potential spread of trajectories of the stream of fuel toward the plasma formation location, a second configuration different than the first configuration that accelerates fuel after being extracted from the nozzle, and at least one of the following configurations different than the first and second configurations:
an extraction configuration to extract fuel from the nozzle,
a deceleration configuration to decelerate fuel constituting the stream of fuel, and
a charge configuration to charge fuel constituting, or that will constitute, the stream of fuel.

15. The lithographic apparatus of claim 14, wherein the lens arrangement comprises a first electrode, a second electrode, and a third electrode, the second electrode being between the first and third electrodes; and
wherein the first configuration comprises a potential difference between the first electrode and the second electrode and a potential difference between the second electrode and the third electrode.

16. A radiation source comprising:
a reservoir configured to retain a volume of fuel;
a nozzle, in fluid connection with the reservoir, and configured to direct a stream of fuel along a trajectory towards a plasma formation location;
a laser configured to direct laser radiation at the stream at the plasma formation location to generate a radiation generating plasma; and
a positive lens arrangement configured to form a first magnetic or electric field configured to extract fuel from the nozzle, a second magnetic or electric field, different than the first magnetic or electric field, configured to redirect fuel toward the plasma formation location, and a third magnetic or electric field, different than the first and second magnetic or electric fields, configured to accelerate fuel after being extracted from the nozzle;
wherein the radiation source is configured to successively and repeatedly switch between generating the first magnetic or electric field, the second magnetic or electric field, and the third magnetic or electric field.

17. The radiation source of claim 16, wherein the third magnetic or electric field is configured to accelerate fuel within the lens arrangement.

18. The radiation source of claim 16, wherein the radiation source is configured to sequentially and repeatedly switch between generating the first magnetic or electric field, the second magnetic or electric field, and the third magnetic or electric field at a rate of at least 100 kHz.

19. The radiation source of claim 16, wherein the lens arrangement comprises a first component, a second component, and a third component, the second component being between the first and third components; and
wherein the first magnetic or electric field is formed between the nozzle and the first component;
wherein the second magnetic or electric field is formed between the second component and at least one of the first component and the second component; and
wherein the third magnetic or electric field is formed between the first component and the third component.

* * * * *